United States Patent [19]

Palanisamy et al.

[11] Patent Number: 6,094,051

[45] Date of Patent: Jul. 25, 2000

[54] APPARATUS AND METHOD FOR DETECTING MEMORY EFFECT IN NICKEL CADMIUM BATTERIES

[75] Inventors: Thirumalai G. Palanisamy, Morris Township; Harmohan Singh, Rockaway; Alpesh Patel, Parsippany; Patrick M. Rudai, Clifton, all of N.J.

[73] Assignee: AlliedSignal Inc., Morristown, N.J.

[21] Appl. No.: 09/153,401

[22] Filed: Sep. 15, 1998

[51] Int. Cl.⁷ .................................................. G01N 27/46
[52] U.S. Cl. .......................................... 324/426; 324/433
[58] Field of Search .................................... 324/433, 426, 324/71.1, 431

[56] References Cited

U.S. PATENT DOCUMENTS

| | | | |
|---|---|---|---|
| 3,921,064 | 11/1975 | Mori et al. | 324/431 |
| 4,433,294 | 2/1984 | Windebank | 324/426 |
| 4,560,937 | 12/1985 | Finge | 324/433 |
| 5,869,969 | 2/1999 | Cividino et al. | 324/431 |
| 5,962,008 | 7/1999 | Palanisamy et al. | 320/132 |

*Primary Examiner*—Josie Ballato
*Assistant Examiner*—Vincent Q. Nguyen
*Attorney, Agent, or Firm*—Loria B. Yeadon

[57] ABSTRACT

The invention provides for a timesaving method of determining whether a nickel cadmium (NiCd) battery is stricken with memory effect. A fully charged NiCd battery under test ("test battery") is subjected to a positive sloped current charge ramp and then a negative sloped current charge ramp while continuously monitoring the battery terminal voltage. The maximum measured terminal voltage of the test battery is compared to the measured terminal voltage of a NiCd battery of the same nominal voltage and capacity and known not to have memory effect ("normal"battery). A NiCd battery is determined to have memory effect if the maximum voltage of the test battery exceeds the maximum voltage of the normal battery.

10 Claims, 7 Drawing Sheets

APPARATUS AND METHOD FOR DETECTING MEMORY EFFECT IN NICKEL CADMIUM BATTERIES

RELATED APPLICATION DATA

This application is related to commonly assigned U.S. Pat. No. 5,926,008 entitled APPARATUS AND METHOD FOR DETERMINING THE CAPACITY OF A NICKEL-CADMIUM BATTERY, filed concurrently herewith and incorporated by reference herein.

GOVERNMENT STATEMENT

All or part of this invention was developed for the United States Navy under Government Contract No. N00164-96-C-0045. The U.S. Government may have certain rights to this invention under the terms of the contract.

BACKGROUND OF THE INVENTION

This invention relates to rechargeable batteries, and more particularly to analyzing nickel cadmium batteries for memory effect. Nickel cadmium batteries suffer from a phenomenon often referred to as the memory effect. The memory effect is the tendency of the battery to adjust its electrical properties to a certain duty cycle to which it has been subjected to for an extended period of time. See, T. R. Crompton, *Battery Reference Book*, 2nd Edition, Chapter 19, page 11, Reed Educational and Professional Publishing, Ltd. The battery provides power at a lower voltage when used beyond this duty cycle. Subsequently, this low power usage limits the useful energy available from the battery. The memory effect is noticed in actual usage only when one tries to use the battery's full capacity after several cycles of partial discharge, but the battery usage time with acceptable voltage is limited by the lower voltage under load.

At the present time, there is no method for determining whether a nickel cadmium battery is stricken with the memory effect without performing a complete discharge.

There is, therefore, a need to detect the memory effect in a completely charged nickel cadmium battery without performing a full discharge.

DESCRIPTION OF THE INVENTION

The invention provides for a timesaving method of determining whether a nickel cadmium (NiCd) battery is stricken with memory effect. A fully charged NiCd battery under test ("test battery") is subjected to a positive sloped current charge ramp and then a negative sloped current charge ramp while continuously monitoring the battery terminal voltage. The maximum measured terminal voltage of the test battery is compared to the measured terminal voltage of a NiCd battery of the same nominal voltage and capacity and known not to have memory effect ("normal" battery) and which undergoes the same current charge ramp and voltage measurements. A NiCd battery is determined to have memory effect if the maximum voltage of the test battery exceeds the maximum voltage of the normal battery. A preferred embodiment of the invention is described below.

Figure 1:
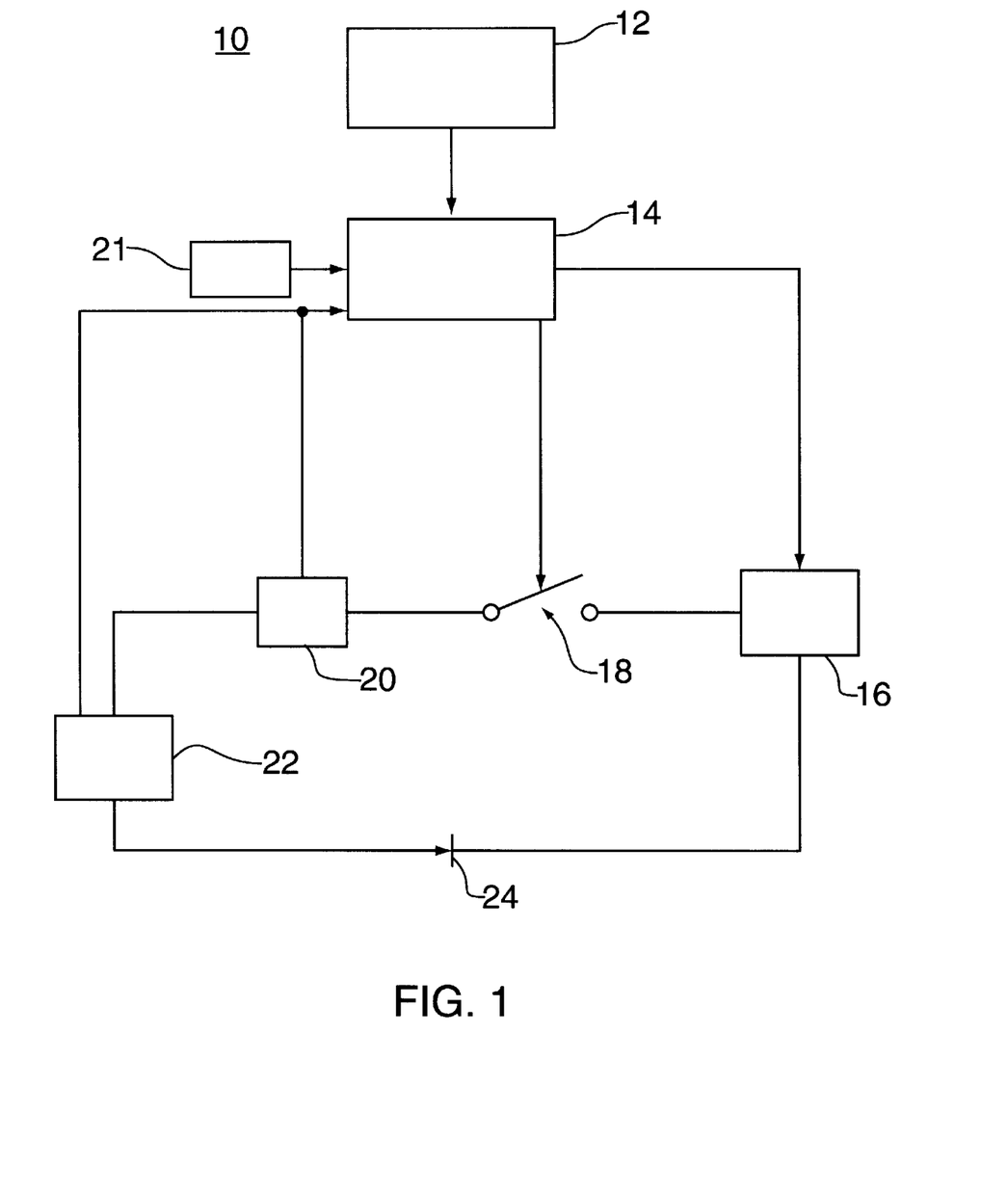
FIG. 1 is a schematic of a battery charging and analyzing circuit.

An exemplary charging system is shown in FIG. 1. A NiCd battery charging system 10 comprises a microprocessor 12 in combination with a data acquisition system 14, such as a National Instruments SCXI data acquisition system. The components of the data acquisition system 14 are Labview 4.0 software, a signal conditioning unit, such as a National Instruments signal conditioning system with digital to analog converters and analog to digital converters and thermocouple modules. System 10 further comprises a programmable power supply 16, a relay 18, a 50A, 50 mV shunt 20 to measure current, a thermocouple 21 to measure temperature, a unit under test 22, in this case, a 24V NiCd battery, and a diode 24 to protect the power supply. In operation, the microprocessor is programmed using Labview 4.0 to control the current output of the power supply 16 and to close/open the relay 18 to electrically connect/disconnect the battery 22. The microprocessor 12 stores the voltage, current and temperature data acquired by the data acquisition hardware.

Figure 2:
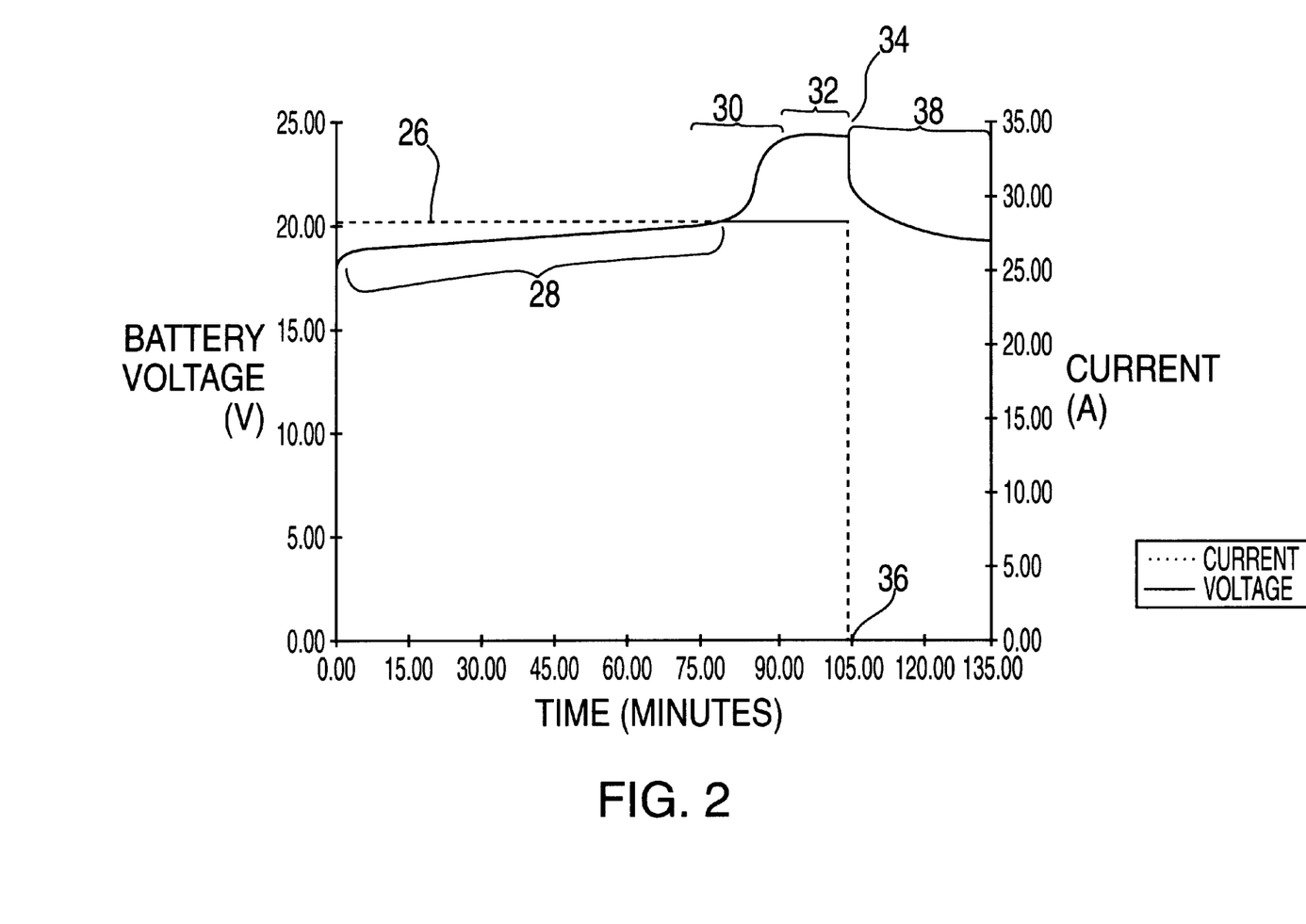
FIG. 2 is a graphical representation of the voltage and current curves during battery charging.

Once attached to the charging system 10, the battery 22 is charged to full capacity, i.e. 100% state of charge, as graphically shown in FIG. 2. This is achieved by applying a constant current 26 to the battery. As the battery is subjected to this constant current charge, the voltage goes through three phases: gradual voltage rise indicating charge reaction, as indicated by time period 28; a sharp voltage rise indicating initiation of gas reaction, as indicated by time period 30; and a plateau region showing simultaneous gas reaction and charge reaction, as indicated by time period 32. During time period 28, the battery voltage gradually rises until the cumulative charge delivered to the battery is about 80 to 90% of the battery's charge capacity. At this point, at least 73% of the battery's capacity is normally available upon discharge. On further charging during time period 30, the battery voltage quickly increases as the battery starts evolving gas towards the end of the charge process. The battery voltage tends to stabilize until the battery is fully charged at the end of time period 32. At time period 34, the battery voltage begins to gradually decrease in the overcharge portion of the charge. After a decrease of 15 mV has been detected in the overcharge, the current charge is terminated at point 36 and the battery is left in open circuit, time period 38 and is fully charged.

Figure 3A:
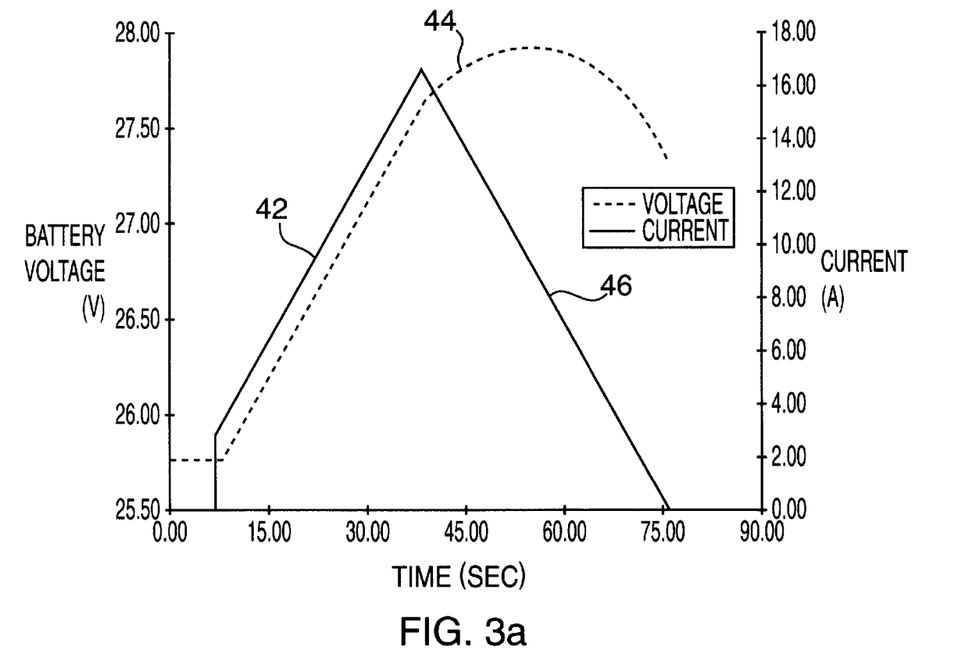
FIG. 3a is a graphical representation of the voltage and current curves in the evaluation cycle of the invention.

After the battery 22 comes to a stabilized status in terms of temperature and open circuit voltage, it is subjected to an evaluation cycle as shown in FIG. 3a. Before starting this evaluation cycle, safe voltage and current limits are established in accordance with the battery characteristics as would be published by the battery manufacturer. During the evaluation cycle, an increasing charge current 42 is applied to the battery. Preferably, the charge current is started from zero and increases linearly up to the maximum current the charging system can output or to the identified safe battery voltage and current limits, whichever is lower. In actual practice, the charge current will be as shown in FIG. 3a due to the output lag time of the power supply compared with the programmed value.

Figure 3B:
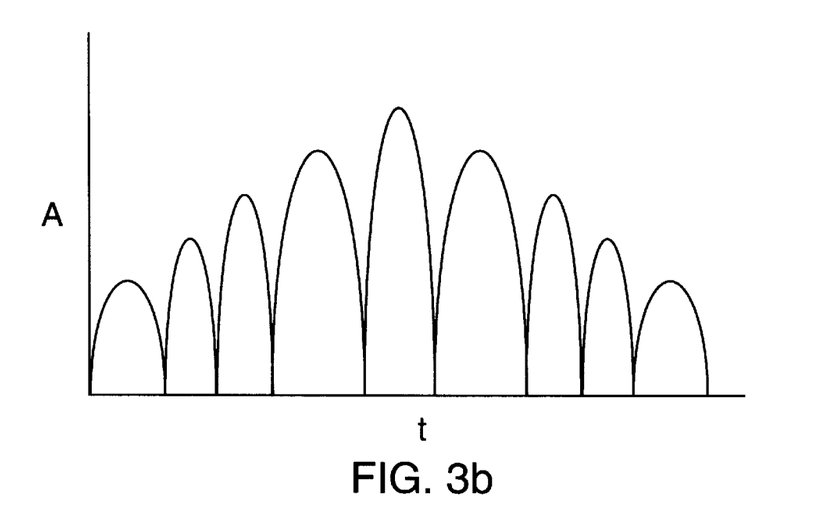
FIG. 3b is an alternate current charging curve.

The increasing current charge does not have to be linear, as long as it increases as a known function of time. Alternatively, consecutive pulses with an increasing current amplitude can also be used during the ramp test as shown in FIG. 3b.

The current charge ramp is then decreased at any negative slope 46 until the current reaches zero. Preferably, the slope of the decreasing current charge is the same slope as the current charge 42. During the current charge phases 42 and 46, the battery terminal voltage 44 is continuously measured and recorded. The maximum measured test battery voltage is determined and compared to the maximum measured voltage of a normal battery, which is also subjected to the same current ramp test.

A NiCd battery with memory effect will experience a higher maximum voltage measured at 44 during the current charge ramp cycle than the maximum voltage measured on the normal battery.

An alternate method for determining memory effect is to examine the slope of the battery voltage curve during the current charge ramp cycle. We have demonstrated that the battery voltage curve exhibits a steeper slope when the battery is stricken by the memory effect.

Another alternate method for determining memory effect is to measure the maximum current required to reach maximum voltage in the current charge ramp cycle. We have demonstrated that the maximum current is lower for a memory-effected battery than a normal battery.

EXAMPLE 1

A 20 Ah, 24V NiCd battery was completely charged using the methodology described above and then completely discharged to determine the capacity of the battery. During the discharge, a constant current is drawn from the battery until the battery voltage reaches 18.05V, which for this purpose is an arbitrary value. The capacity of the battery is calculated by multiplying the current drawn from the battery and the time required to reach 18.05V. Three charge/discharge cycles were completed, and the average battery capacity was calculated. Next, the time required to discharge the battery to 50% state of charge is determined from the battery's average capacity. The battery was cycled five times by discharging the battery to 50% state of charge followed by recharging to full capacity by the above procedure shown in FIG. 2.

After each of the recharge cycles, the battery was subjected to a current charge ramp test (FIG. 3). The current slope used for the ramp cycle was a 0.22 A step every 500 milliseconds. The tests were performed with a voltage limit of 27.55 V and a current limit of 30 A. The 20 Ah battery was then subjected to a sixth 50% duty cycle, at which point the battery had the characteristics of a memory effected battery. The battery was then reconditioned that includes a complete discharge to 18.05V.

Figure 4:
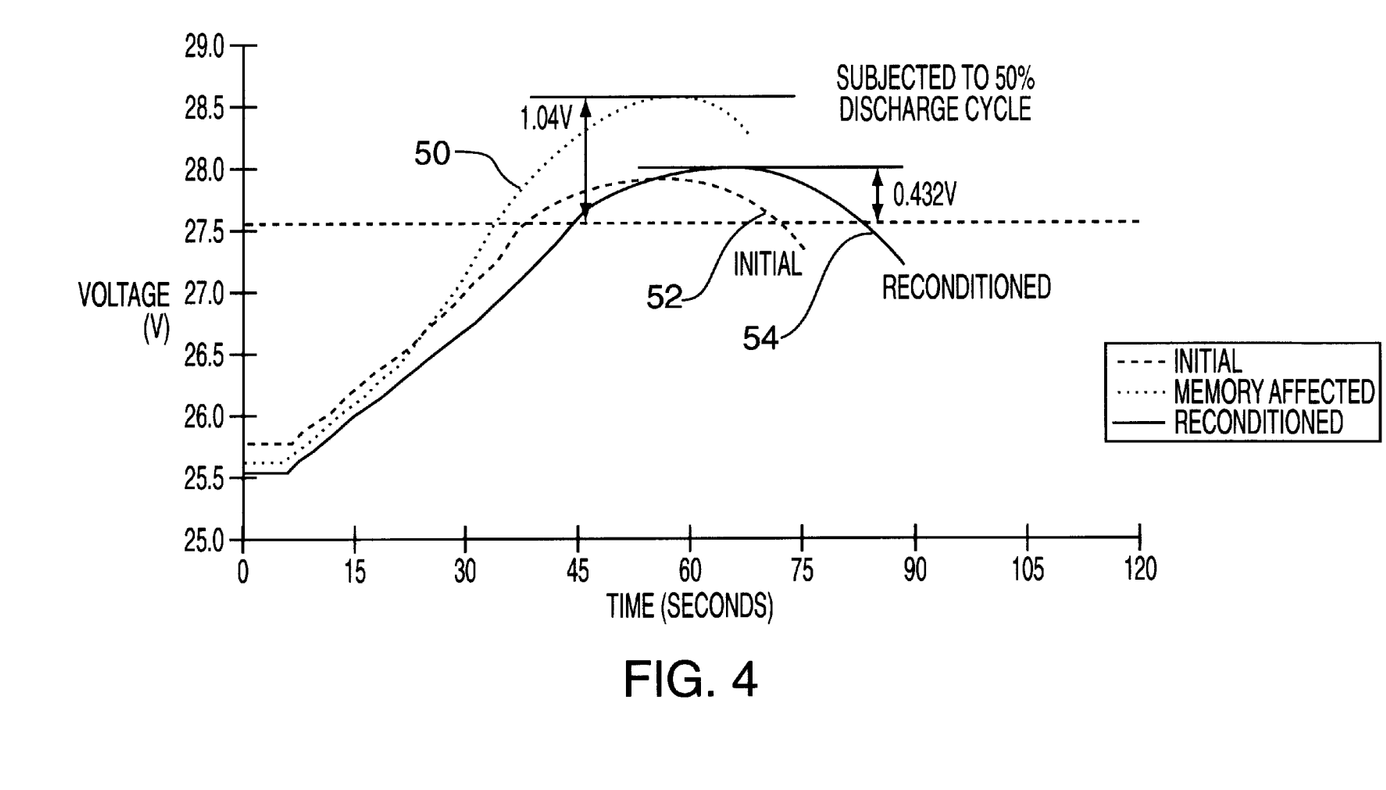
FIG. 4 is a graphical representation illustrating the results of numerous evaluation cycles of a 20 Ah NiCd battery.

Referring to FIG. 4, curve 50 represents the behavior of a battery suffering from the memory effect during the current charge ramp test. The battery developed memory effect when it was subjected to five 50% duty cycles as described above. Curves 52 and 54 illustrate the battery voltage behavior before inducing the memory effect and after reconditioning the battery to eliminate the memory effect, respectively. It is evident that the slope of curve 50 is steeper than the slopes of curves 52 and 54. In addition, it was demonstrated that the battery with memory effect had a maximum voltage of 28.4 V during the ramp cycles, while the initial and reconditioned state of the battery displayed peak voltages less than 27.9 V. Also, it is important to note that as the battery was subjected to the repeated 50% duty cycling to induce the memory effect, the peak voltage increased during each successive current charge ramp cycle.

Figure 5:
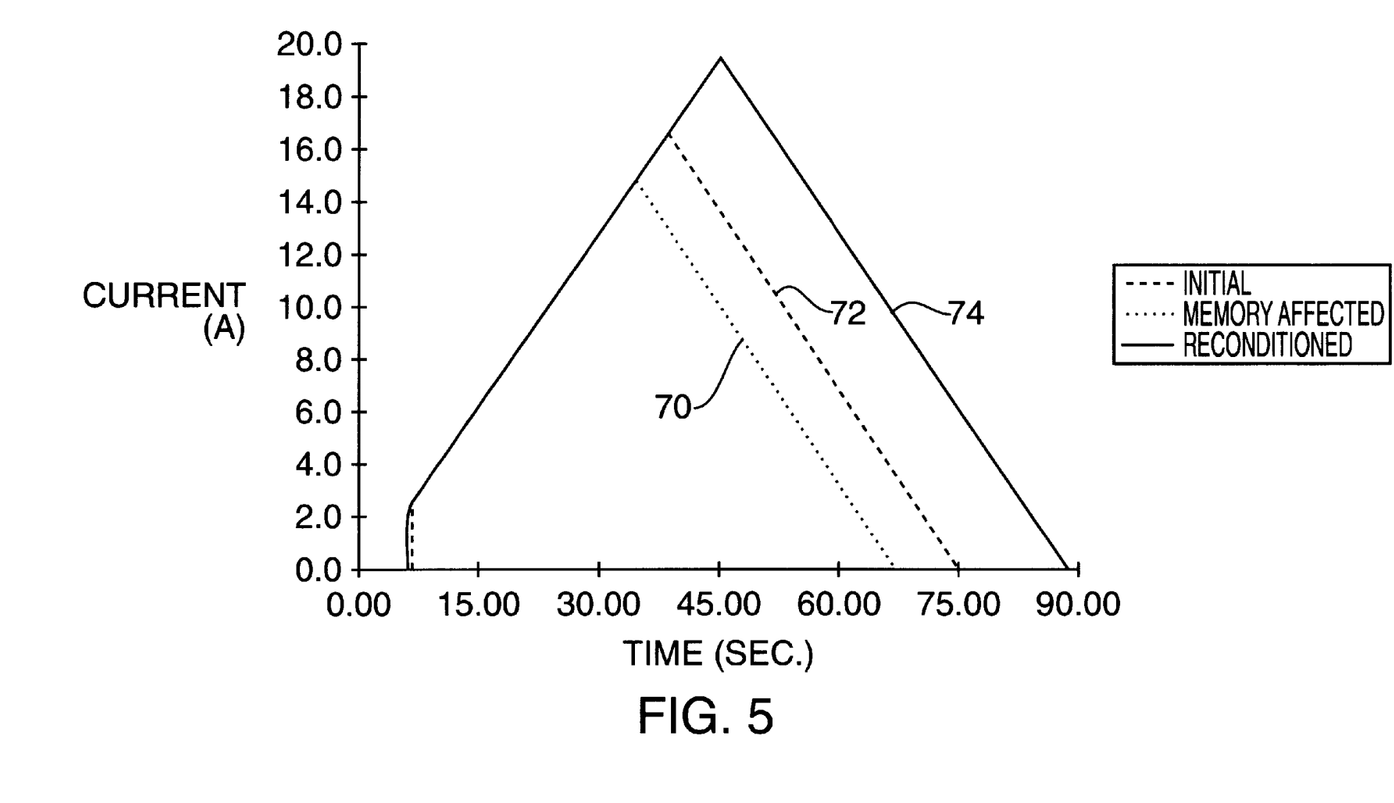
FIG. 5 is a graphical representation of the maximum charging current for a 20 Ah memory effect battery and a normal battery.

FIG. 5 illustrates the variation of current charge magnitude during the current ramp cycles. The battery, in its initial, memory effect and reconditioned states, was subjected to a current charge ramp cycle with a voltage limitation of 27.55 V. Once the maximum voltage is reached the slope of the current ramp will change direction (FIG. 3). Since the measured battery terminal voltage rises faster for the memory effect state, the voltage limit is reached quicker. Accordingly, this limits the maximum current during the ramp test when there is memory effect in the battery. As shown in FIG. 5, the memory effect battery has the smallest maximum charge current maximum, curve 70, compared with the maximum current charge for the initial and the reconditioned states of the battery, curves 72 and 74, respectively.

EXAMPLE 2

Figure 6:
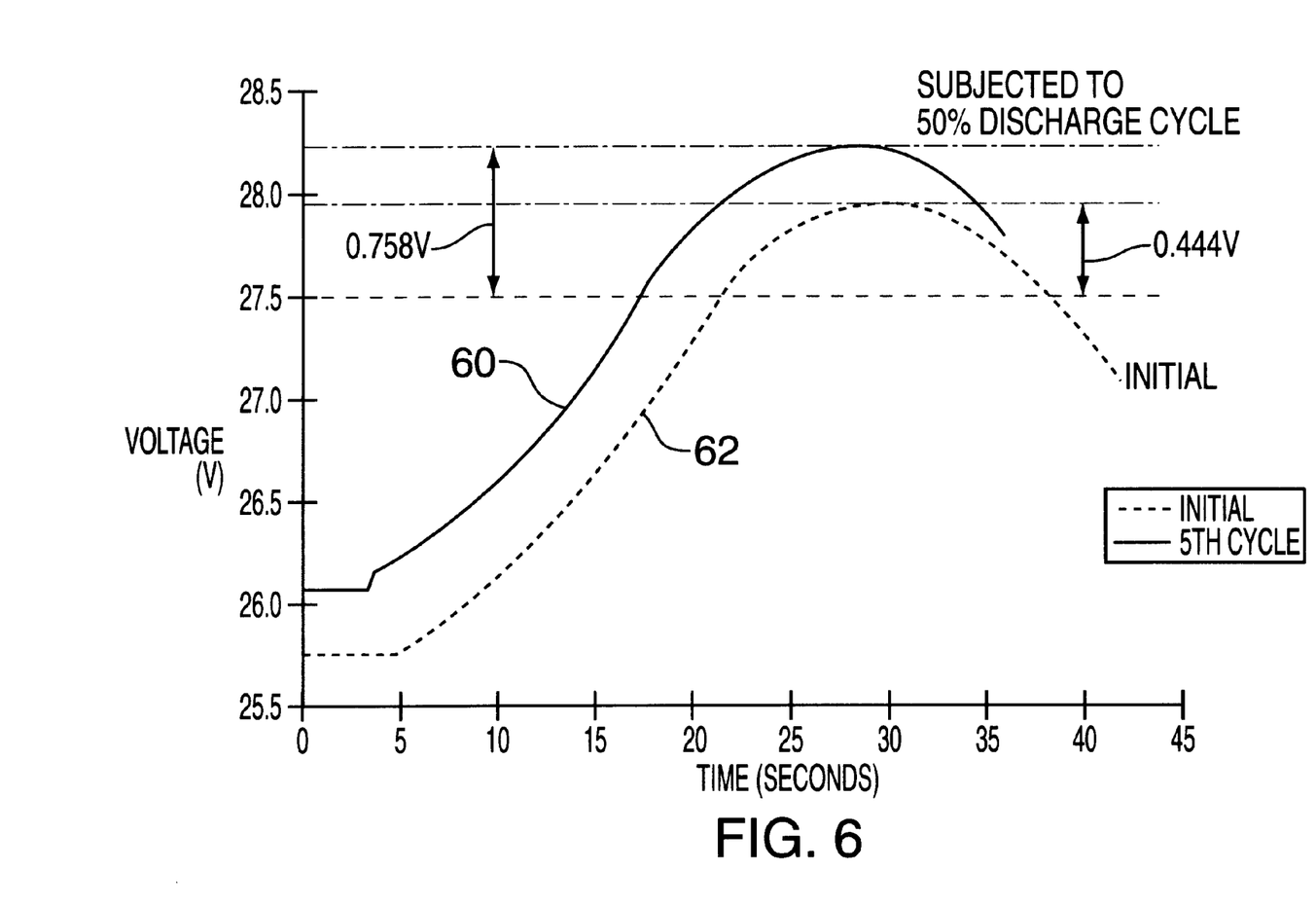
FIG. 6 is a graphical representation illustrating the results of numerous evaluation cycles of a 10 AH NiCd battery.

The same procedures and tests were performed on a 10 Ah NiCd battery. Referring to FIG. 6, curve 60 indicates that the 10 Ah memory effected battery develops a voltage rise earlier in time and also exhibits a steeper slope than the initial voltage curve 62. Further, the memory-effected battery under test had a maximum voltage of 28.2 V during the ramp test, while initial and reconditioned battery states exhibited peak voltages less than 28.0 V.

Figure 7:
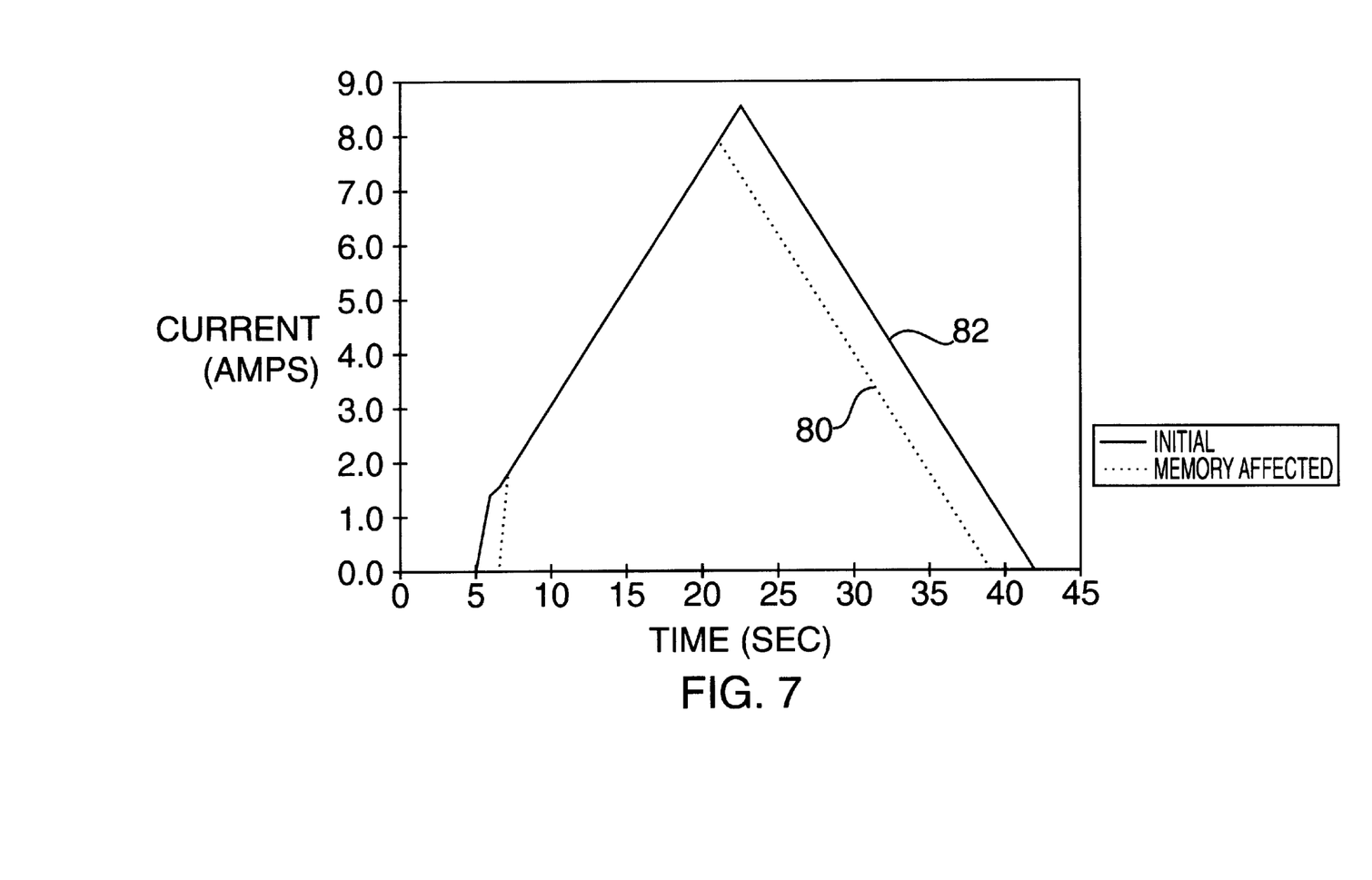
FIG. 7 is a graphical representation of the maximum charging current for a 10 Ah memory effect battery and a normal battery.

FIG. 7 shows that the memory effect battery reaches a lower value of the maximum current during the ramp cycle, curve 80, compared with that of the initial battery state, curve 82.

The safe voltage and current limits imposed to the system during the ramp test cycle significantly affect the battery voltage. Therefore it is important to remember that one can set these limits at different values, within a certain range, for nickel cadmium batteries and generate different calibration curves. As long as the battery whose capacity has to be determined is subjected to the same conditions as the batteries used to determine the calibration curve, the results should duplicate those disclosed. For example, the safe voltage limit for nickel-cadmium batteries can be set at in the range 1.3 to 1.65 volts per cell.

It will be understood that the particular embodiments described above are only illustrative of the principles of the present invention, and that various modifications could be made by those skilled in the art without departing from the scope and spirit of the present invention, which is limited only by the claims that follow.

We claim:

1. A method for determining whether a fully charged nickel cadmium battery has a memory effect electrical properties defect as opposed to other possible battery defects, said method comprising the steps of:

subjecting said battery to a slowly increasing charge current and then a decreasing charge current;

measuring the battery terminal voltage after subjecting said battery to said slowly increasing and then a decreasing charge current and determining the maximum measured voltage; and comparing the maximum voltage thus determined to a threshold value;

whereby if the maximum voltage is greater than said threshold value, the battery has a memory effect electrical properties defect.

2. The method of claim 1, wherein said slowly increasing charge current increases as a function of time.

3. The method of claim 1 wherein said slowly increasing charge current comprises current pulses with each subsequent current pulses having a higher current magnitude than the preceding current pulse.

4. The method of claim 1 wherein said decreasing charge current decreases as a function of time at the same rate as said slowly increasing charge current.

5. The method of claim 1 wherein said decreasing charge current comprises current pulses with each subsequent current pulse having a lower current magnitude than the preceding current pulse.

6. The method of claim 2 wherein the rate of said charge current is a 0.22 A/500 millisecond step.

7. A method for determining whether a first fully charged nickel cadmium battery has memory effect electrical properties comprising the steps of:

a) subjecting said battery to a slowly increasing charge current and then a decreasing charge current;

b) subjecting a second, fully charged nickel cadmium battery without memory effect electrical characteristics to a slowly increasing charge current and then a decreasing charge current;

c) measuring the first and second battery terminal voltages during steps (a) and (b) and determining the maximum measured voltage of each battery; and d) comparing the maximum voltages of the first and second batteries;

whereby if the maximum voltage of the first battery is greater than the maximum voltage of the second battery, the first battery has memory electrical properties.

8. Apparatus for determining whether a fully charged nickel cadmium battery has memory effect electrical characteristics comprising:

current means for generating a slowly increasing charge current applied to the battery and also for generating a decreasing charge current applied to the battery subsequent to the increasing current charge;

voltage sensing means for sensing the battery terminal voltage during application of the charge current; and comparing means for comparing the maximum battery voltage to a threshold value;

whereby if the maximum voltage is greater than said threshold value, the battery has memory effect properties.

9. A method for determining whether a fully charged nickel cadmium battery has memory effect electrical properties comprising the steps of:

a) subjecting said battery to a slowly increasing charge current and then a decreasing charge current;

b) measuring the battery terminal voltage during step (a) and determining the rate of change of the measured voltage with time; and c) comparing the measured voltage rate of change to a threshold value;

whereby if the measured voltage rate of change is greater than said threshold value, the battery has memory effect electrical properties.

10. A method for determining whether a fully charged nickel cadmium battery with a given nominal voltage rating has memory effect electrical properties comprising the steps of:

a) subjecting said battery to a slowly increasing charge current until the battery reaches a predetermined voltage value greater than the nominal voltage rating and then to a decreasing charge current;

b) measuring the current magnitude during step (a); and c) comparing the current magnitude to a threshold value;

whereby if the measured current magnitude is less than said threshold value, the battery has memory effect electrical properties.

* * * * *